(12) United States Patent
Huang et al.

(10) Patent No.: US 8,674,217 B2
(45) Date of Patent: Mar. 18, 2014

(54) CABLE-ORGANIZING CIRCUIT BOARD AND AN ELECTRONIC DEVICE INCORPORATING THE SAME

(75) Inventors: Chih-Ping Huang, Taipei Hsien (TW); Kun-Hui Lai, Taipei Hsien (TW); Cheng-Hsiang Chuang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 374 days.

(21) Appl. No.: 13/005,287

(22) Filed: Jan. 12, 2011

(65) Prior Publication Data

US 2011/0228496 A1    Sep. 22, 2011

(51) Int. Cl.
*H02G 3/32* (2006.01)
*H02G 7/08* (2006.01)

(52) U.S. Cl.
USPC ........... 174/40 CC; 174/59; 174/64; 361/748; 361/752; 361/825

(58) Field of Classification Search
CPC .................. H01R 4/64; H05K 2201/10689
USPC ......... 174/40 CC, 59–64; 361/825–827, 748, 361/752, 753
See application file for complete search history.

(56) References Cited

U.S. PATENT DOCUMENTS

| | | | | |
|---|---|---|---|---|
| 5,825,635 A | * | 10/1998 | Mukoyama et al. | 361/826 |
| 6,285,565 B1 | * | 9/2001 | .ANG.berg et al. | 361/826 |
| 6,290,532 B1 | * | 9/2001 | Vermeersch et al. | 439/460 |
| 6,597,584 B1 | * | 7/2003 | Ray et al. | 361/798 |
| 7,304,861 B2 | * | 12/2007 | Takahashi | 361/760 |
| 2008/0130213 A1 | * | 6/2008 | Goto et al. | 361/683 |
| 2010/0073900 A1 | * | 3/2010 | Tachikawa et al. | 361/826 |

FOREIGN PATENT DOCUMENTS

JP    2005197267 A  *  7/2005
JP    2009224535 A  *  10/2009

* cited by examiner

*Primary Examiner* — Hoa C Nguyen
(74) *Attorney, Agent, or Firm* — Steptoe & Johnson LLP

(57) ABSTRACT

A cable-organizing circuit board includes a board body and a protruding hanger arm. The board body has a circuit-layout section and a non-circuit-layout section that are connected to each other. The protruding hanger arm is disposed at the non-circuit-layout section of the board body, and is adapted to be permit a segment of the transmission cable to pass thereunder. The segment of the transmission cable is disposed beneath a bottom surface of the protruding hanger arm, and remaining segments of the transmission cable are disposed above a top surface of the board body opposite to the bottom surface of the protruding hanger arm when the segment of the transmission cable passes under the protruding hanger arm.

8 Claims, 9 Drawing Sheets

US 8,674,217 B2

CABLE-ORGANIZING CIRCUIT BOARD AND AN ELECTRONIC DEVICE INCORPORATING THE SAME

CROSS-REFERENCE TO RELATED APPLICATION

This application claims priority of Taiwanese Application No. 099204759, filed on Mar. 18, 2010.

BACKGROUND OF THE INVENTION

1. Field of the Invention

The invention relates to a cable-organizing circuit board and an electronic device including the cable-organizing circuit board, more particularly to a cable-organizing circuit board that is provided with a protruding hanger arm for facilitating organization of a transmission cable and to an electronic device incorporating the cable-organizing circuit board.

2. Description of the Related Art

During assembly of notebook computers, cable organization is an important step. Conventional cable-organizing methods include the following:

As shown in FIG. 1, after a transmission cable 11 is arranged in a predefined route, several adhesive tape segments 12 are used to adhere the transmission cable 11 to a circuit board 13 or to a housing (not shown). However, one disadvantage of this method is that the adhesiveness of the adhesive tape segments 12 is material dependent, and may deteriorate due to an increase in operating temperature of electronic components on the circuit board 13 or inside the housing. Therefore, the adhesive tape segments 12 may easily fall off, resulting in unstable positioning of the transmission cable 11 on the circuit board 13 or on the housing. Moreover, this method is time-consuming, and the use of the adhesive tape segments 12 increases cost.

As shown in FIG. 2, Taiwanese Utility Model Patent No. M291072 discloses a notebook computer housing 14 that is provided on an inner surface thereof with a plurality of cable-organizing clips 15 at different locations. Each cable-organizing clip 15 consists of two curved plates 151 that cooperate to hold a transmission cable 16 therebetween. However, the transmission cable 16 tends to slip out of the space between the curved plates 151. In addition, during assembly of other electronic components (e.g., a circuit board or a heat sink), the curved plates 151 of the cable-organizing clips 15 may break or be deformed due to accidental impact.

As shown in FIG. 3, Chinese Patent No. ZL200820057679.8 discloses a cable-organizing board 17, which is formed with a plurality of cable-organizing grooves 171, 172 for receiving transmission cables 18. When it is desired to mount the cable-organizing board 17 inside a notebook computer housing, it is necessary to provide adhesives or double-sided adhesives on the back of the cable-organizing board 17 in order to fix the cable-organizing board 17 inside the housing. This kind of cable-organizing method requires the developing of an additional mold for production of the cable-organizing board 17, thereby increasing the production cost for an electronic device (e.g., a notebook computer) incorporating the same. Moreover, while the space inside the housing is already limited, with the presence of the cable-organizing board 17, space available for other electronic components is reduced accordingly.

SUMMARY OF THE INVENTION

Therefore, the object of the present invention is to provide a cable-organizing circuit board that reduces the time it takes for assembling a transmission cable thereto, that maintains the tidiness and positioning stability of the transmission cable, that is relatively less costly, and that does not reduce the space available for other electronic components in an electronic device incorporating the cable-organizing circuit board in comparison with an ordinary circuit board.

Another object of the present invention is to provide an electronic device that includes a cable-organizing circuit board, that reduces the time it takes for assembling a transmission cable thereto, that maintains the tidiness and positioning stability of the transmission cable, that is relatively less costly, and that does not reduce the space available for other electronic components in the electronic device in comparison with an ordinary circuit board.

According to one aspect of the present invention, there is provided a cable-organizing circuit board adapted for use with a transmission cable. The cable-organizing circuit board includes a board body and a protruding hanger arm.

The board body has a circuit-layout section and a non-circuit-layout section that are connected to each other. The protruding hanger arm is disposed at the non-circuit-layout section of the board body. The protruding hanger arm is adapted to be permit a segment of the transmission cable to pass thereunder. The segment of the transmission cable is disposed beneath a bottom surface of the protruding hanger arm, and remaining segments of the transmission cable are disposed above a top surface of the board body opposite to the bottom surface of the protruding hanger arm when the segment of the transmission cable passes under the protruding hanger arm.

Preferably, the protruding hanger arm is co-planar with the board body. The protruding hanger arm is generally T-shaped, and includes a connecting arm portion connected to the board body, and a stop arm portion formed at a distal end of the connecting arm portion and adapted for preventing the transmission cable from slipping off the protruding hanger arm.

In one embodiment, the connecting arm portion is connected to an outer sidewall of the board body at the non-circuit-layout section.

In another embodiment, the board body of the cable-organizing circuit board is formed with a through hole in the non-circuit-layout section. The through hole is adapted to permit extension of the transmission cable therethrough. The connecting arm portion is connected to an inner sidewall of the board body.

In one embodiment, the inner sidewall has an open configuration, and includes a first wall portion connected to the connecting arm portion of the protruding hanger arm, and two second wall portions connected to the first wall portion and respectively spaced apart from opposite sides of the protruding hanger arm. The through hole has an open side formed between the second wall portions.

In another embodiment, the inner sidewall has a closed configuration, and includes a first wall portion connected to the connecting arm portion of the protruding hanger arm, two second wall portions connected to the first wall portion and respectively spaced apart from opposite sides of the protruding hanger arm, and a third wall portion connected between the second wall portions and spaced apart from the stop arm portion of the protruding hanger arm.

Preferably, the cable-organizing circuit board includes a plurality of the protruding hanger arms disposed at the non-circuit-layout section of the board body.

According to another aspect of the present invention, there is further provided an electronic device that includes a housing, a transmission cable, and a cable-organizing circuit board.

The housing forms a receiving space. The transmission cable is disposed in the receiving space. The cable-organizing circuit board is disposed in the receiving space, and includes a board body and a protruding hanger arm. The board body has a circuit-layout section and a non-circuit-layout section that are connected to each other. The protruding hanger arm is disposed at the non-circuit-layout section of the board body. A segment of the transmission cable passes under the protruding hanger arm such that the segment of the transmission cable is disposed beneath a bottom surface of the protruding hanger arm, and remaining segments of the transmission cable are disposed above a top surface of the board body opposite to the bottom surface of the protruding hanger arm.

Preferably, the transmission cable has a bent portion that is formed with the segment of the transmission cable passing under the protruding hanger arm. In one embodiment, a distance between the third wall portion and the stop arm portion of the protruding hanger arm is not greater than an outer diameter of the transmission cable. In another embodiment, the electronic device further includes an abrasion-resistant sleeve sleeved on the bent portion of the transmission cable for contacting the protruding hanger arm. A distance between the third wall portion and the stop arm portion of the protruding hanger arm is not greater than an outer diameter of the abrasion-resistant sleeve. Accordingly, the bent portion of the transmission cable may be prevented from slipping off the protruding hanger arm.

With the features described above, the electronic device incorporating the cable-organizing circuit board according to the present invention has the following effects and advantages. Through the design of the protruding hanger arm of the cable-organizing circuit board and the optional design of the through hole, the transmission cable can be directly passed beneath the protruding hanger arm, or be quickly extended through the through hole and passed beneath the protruding hanger arm, such that the transmission cable is neatly and stably positioned on the cable-organizing circuit board. As such, the time and production cost for cable organization is reduced, and the space available for other electronic components of the electronic device is not undesirably reduce in comparison with an ordinary circuit board.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE PREFERRED EMBODIMENTS

Figure 1:
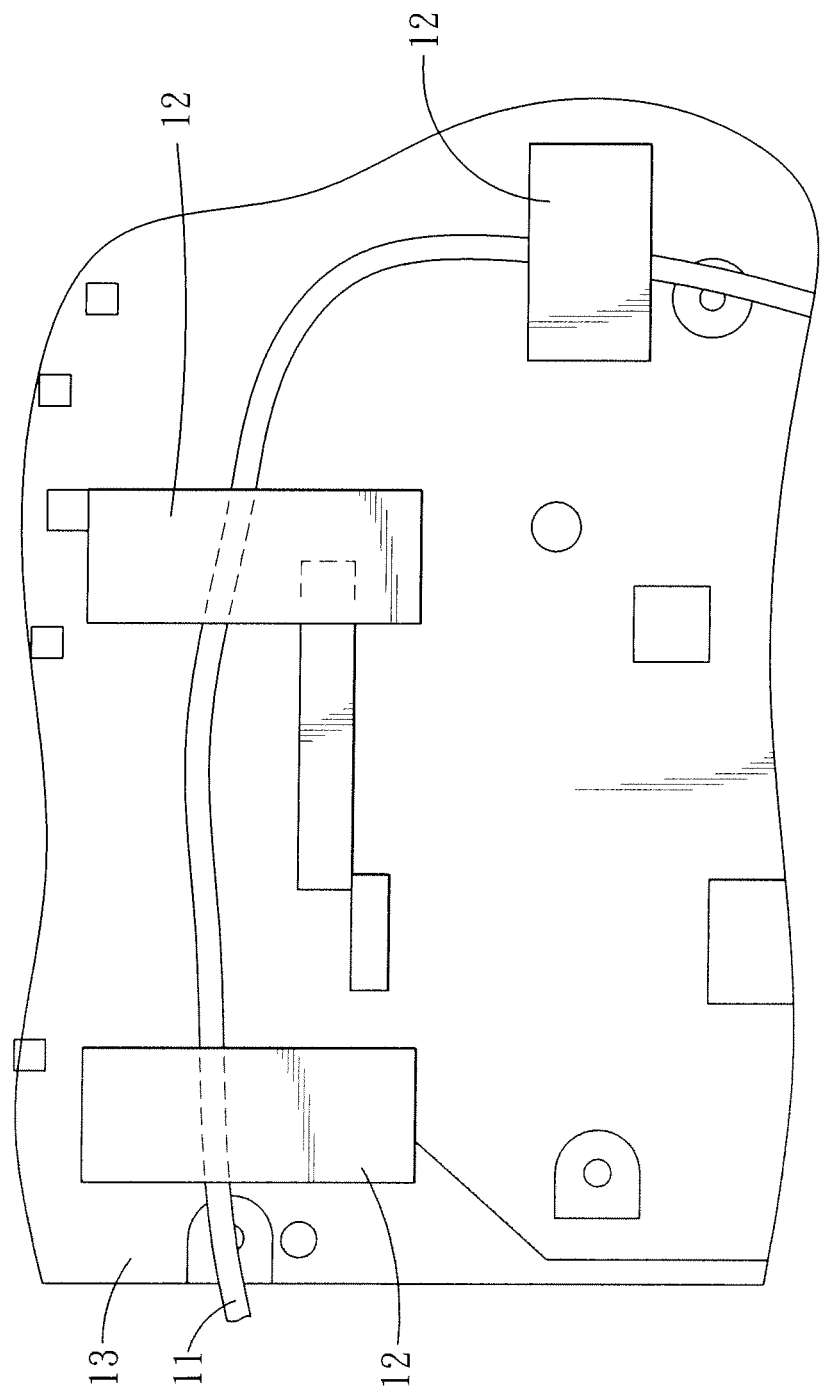
FIG. 1 is a schematic diagram, illustrating a first conventional cable-organizing method.
Figure 2:
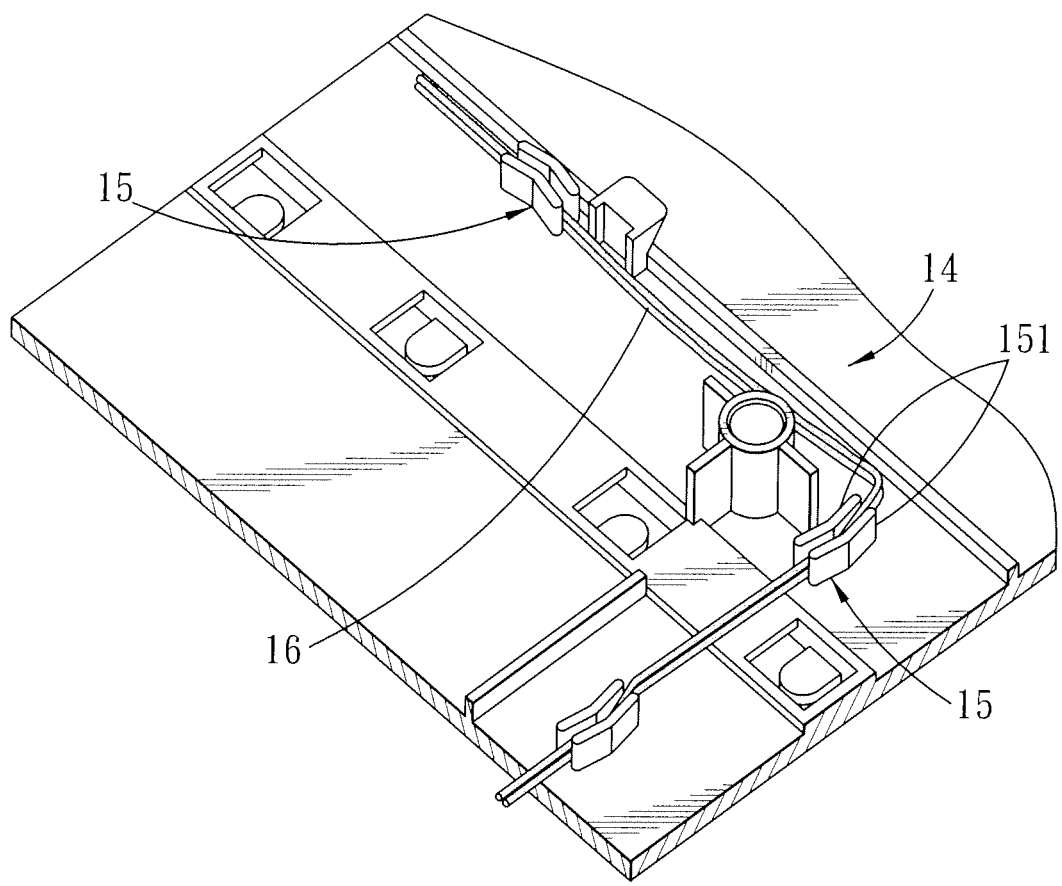
FIG. 2 is a schematic diagram, illustrating a second conventional cable-organizing method.
Figure 3:
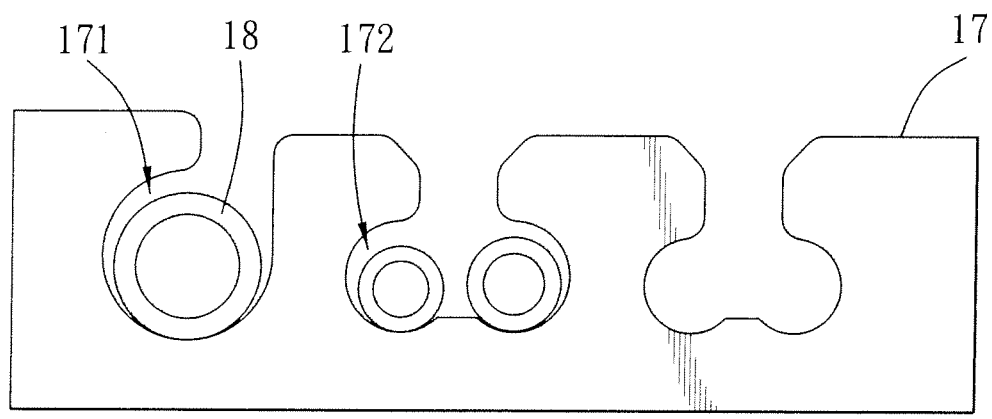
FIG. 3 is a schematic diagram, illustrating a third conventional cable-organizing method.

Before the present invention is described in greater detail, it should be noted that like elements are denoted by the same reference numerals throughout the disclosure.

Figure 4:
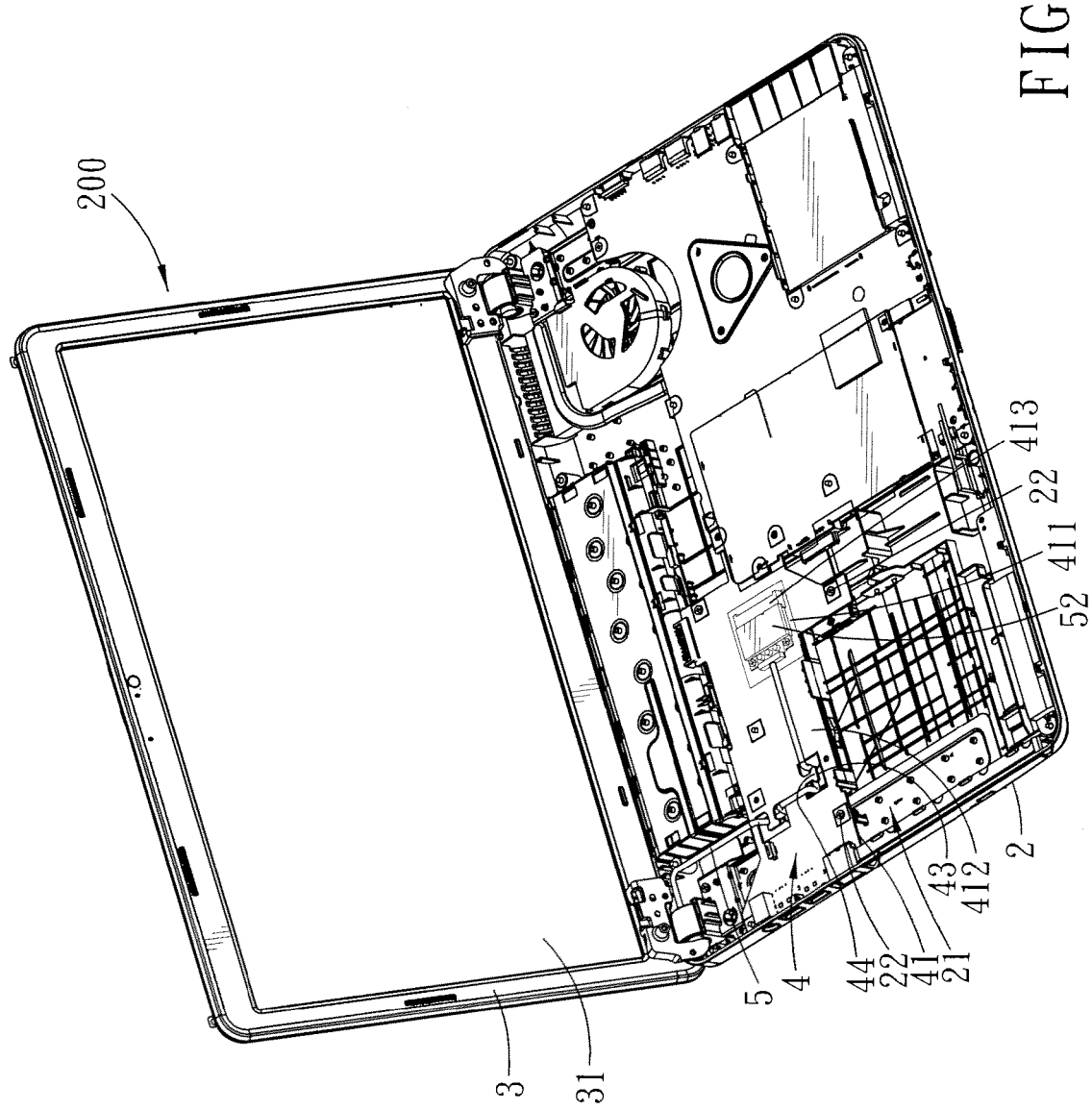
FIG. 4 is a perspective view of the first embodiment of an electronic device incorporating a cable-organizing circuit board according to the present invention.

With reference to FIG. 4, the first embodiment of an electronic device 200 incorporating a cable-organizing circuit board 4 according to the present invention is shown. The electronic device 200 includes a housing 2, a display screen 3 pivoted to a rear side of the housing 2, a cable-organizing circuit board 4, and a transmission cable 5. In this embodiment, the electronic device 200 is illustrated as a notebook computer. However, it is noted herein that, in practice, the electronic device 200 may be a cellular phone, a personal digital assistant (PDA), a server, a tablet computer, etc.

Figure 5:
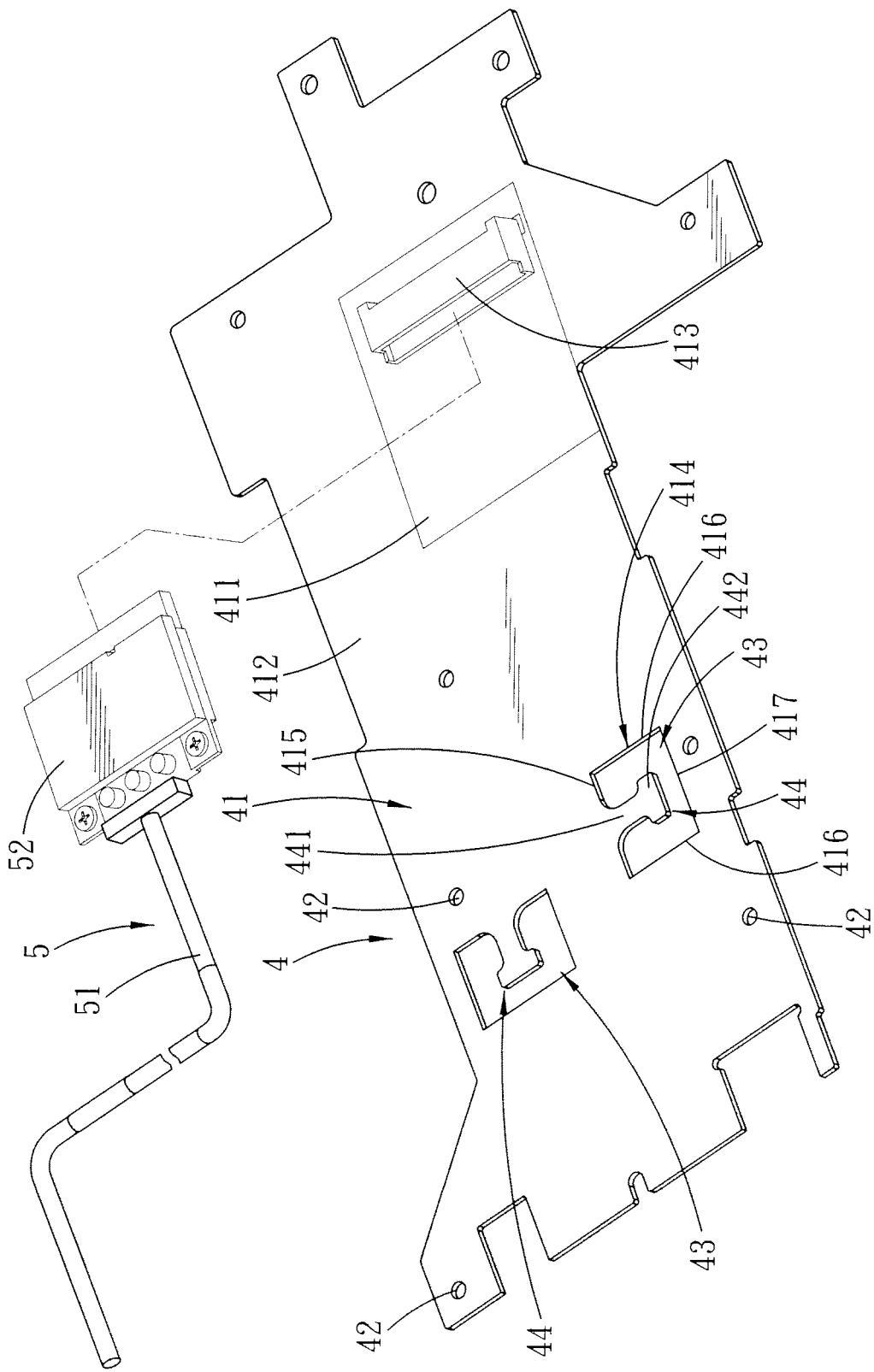
FIG. 5 is a perspective view of the cable-organizing circuit board and a transmission cable according to the first embodiment.

As shown in FIG. 4 and FIG. 5, the housing 2 forms a receiving space 21 for receiving the cable-organizing circuit board 4 and the transmission cable 5 therein. The cable-organizing circuit board 4 includes a board body 41 that is formed with a plurality of holes 42. The cable-organizing circuit board 4 is fastened to the housing 2 so as to be positioned in the receiving space 21 using a plurality of screw fasteners 22 that respectively extend through the holes 42. The board body 41 of the cable-organizing circuit board 4 has a circuit-layout section 411 and a non-circuit-layout section 412 that are connected to each other. The circuit-layout section 411 is provided with a socket electrical connector 413. The transmission cable 5 includes a cable body 51, one end of which is connected to a display panel 31 of the display screen 3, the other end of which is provided with a plug electrical connector 52 capable of plugging into the socket electrical connector 413. By plugging the plug electrical connector 52 into the socket electrical connector 413, the display panel 31 is connected electrically to the cable-organizing circuit board 4 via the transmission cable 5, thereby permitting transmission of electrical power and display signals from the cable-organizing circuit board 4 to the display panel 31. In this embodiment, the cable-organizing circuit board 4 is illustrated as a motherboard. However, in practice, the cable-organizing circuit board 4 may also be other types of circuit boards. Moreover, although the transmission cable 5 is shown to have one end for connecting to the display panel 31 and the other end for connecting to the plug electrical connector 413 in this embodiment, the two ends of the transmission cable 5 may be connected to other electrical components in other embodiments of the present invention.

The board body 41 of the cable-organizing circuit board 4 is formed with a plurality of through holes 43 in the non-circuit-layout section 412 for extension of the transmission cable 5 therethrough. The cable-organizing circuit board 4 further includes a plurality of protruding hanger arms 44 that are respectively disposed at the non-circuit-layout section 412 of the board body 41. The board body 41 has a plurality of inner sidewalls 414 that respectively form the through holes 43. In this embodiment, each of the inner sidewalls 414 has a closed rectangular configuration, and includes a first wall portion 415, two second wall portions 416 connected to opposite sides of the first wall portion 415, and a third wall portion 417 connected between the second wall portions 416 and opposite to the first wall portion 415. Each of the protruding hanger arms 44 is generally T-shaped, and includes a connecting arm portion 441 connected to the first wall portion 415 of a corresponding one of the inner sidewalls 414 of the board body 41, and a stop arm portion 442 formed at a distal end of the connecting arm portion 441 and spaced apart from the third wall portion 417 of the corresponding one of the inner sidewalls 414. Since the second wall portions 416 of each of the inner sidewalls 414 are spaced apart from each other and are disposed on opposite sides of the corresponding one of the protruding hanger arms 44, and since the third wall portion 417 of each of the inner sidewalls 414 is spaced apart from the stop arm portion 442 of the corresponding one of the protruding hanger arms 44, segments of the cable body 51 of the transmission cable 5 are respectively extendable into the through holes 43 so as to pass respectively under the protruding hanger arms 44 such that said segments of the cable body 51 of the transmission cable 5 are each disposed beneath a bottom surface of the corresponding one of the protruding hanger arms 44, while remaining segments of the cable body 51 of the transmission cable 5 are disposed above a top surface of the board body 41 opposite to the bottom surface of the protruding hanger arms 44, thereby achieving the effect of cable organization.

In this embodiment, the cable-organizing circuit board 4 is manufactured through milling machining, where the through holes 43 and the protruding hanger arms 44 are formed during milling of the board body 41. Therefore, the protruding hanger arms 44 are co-planar with the board body 41, and the extra step of assembling a separate cable-organizing mechanism or structure to an ordinary circuit board as with the prior art is no longer necessary. Therefore, production cost for the electronic device 200 incorporating the cable-organizing circuit board 4 is reduced, and the space available in the receiving space 21 for other electronic components of the electronic device 200 is not undesirably reduced with the presence of the cable-organizing circuit board. In comparison, in the prior art, an additional cable-organization structure is needed, such that a portion of the space left in the receiving space by the conventional circuit board is occupied by the additional cable-organization structure. Furthermore, the number and locations of the through holes 43 and the protruding hanger arms 44 may be designed in accordance with the arrangement of the transmission cable 5 on the board body 41, and may all be correspondingly formed during formation of the board body 41 through milling machining.

Figure 6:
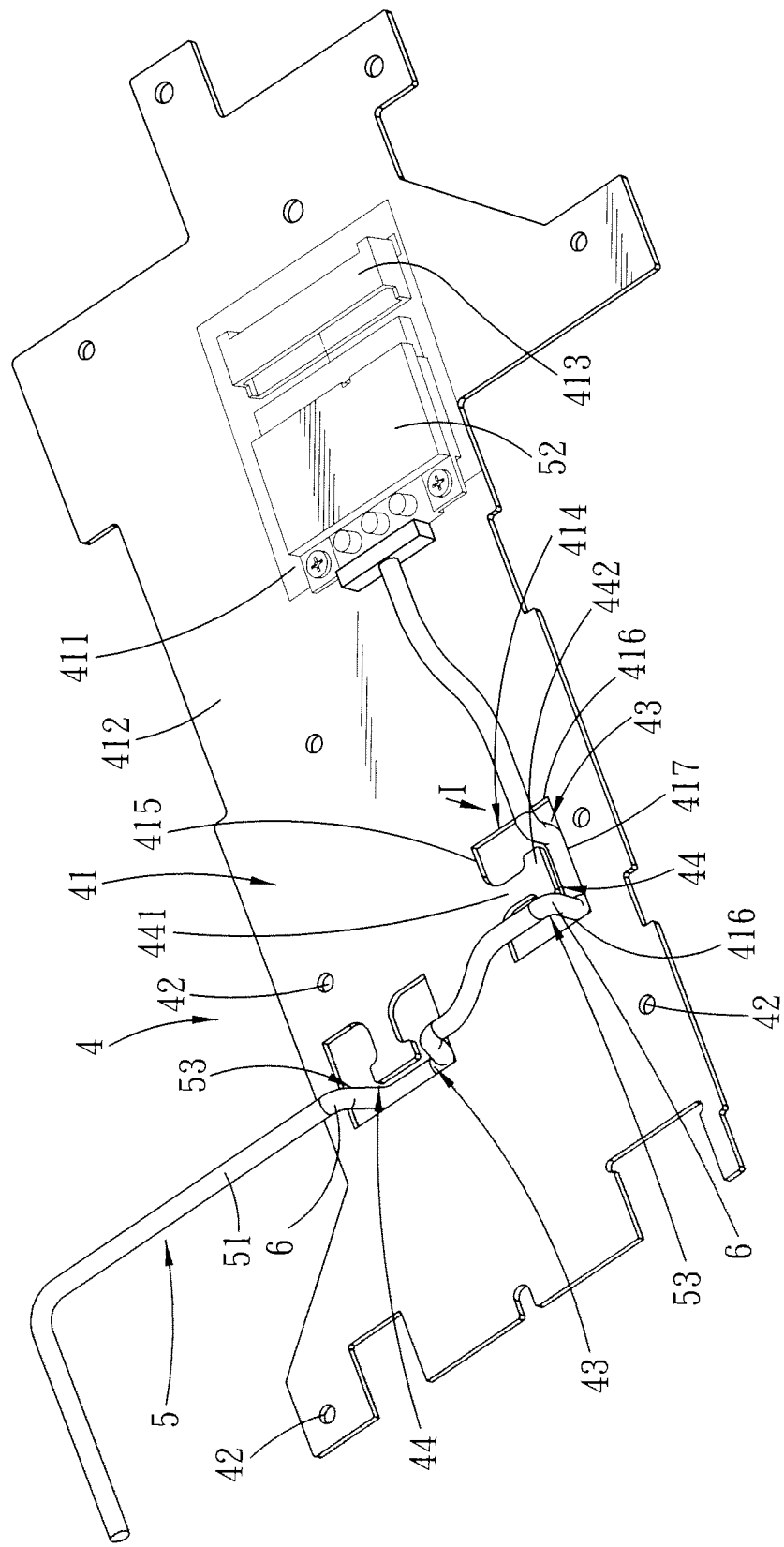
FIG. 6 and FIG. 7 are perspective views similar to FIG. 5, respectively illustrating the operation steps for assembling bent portions of the transmission cable to protruding hanger arms of the cable-organizing circuit board.
Figure 7:
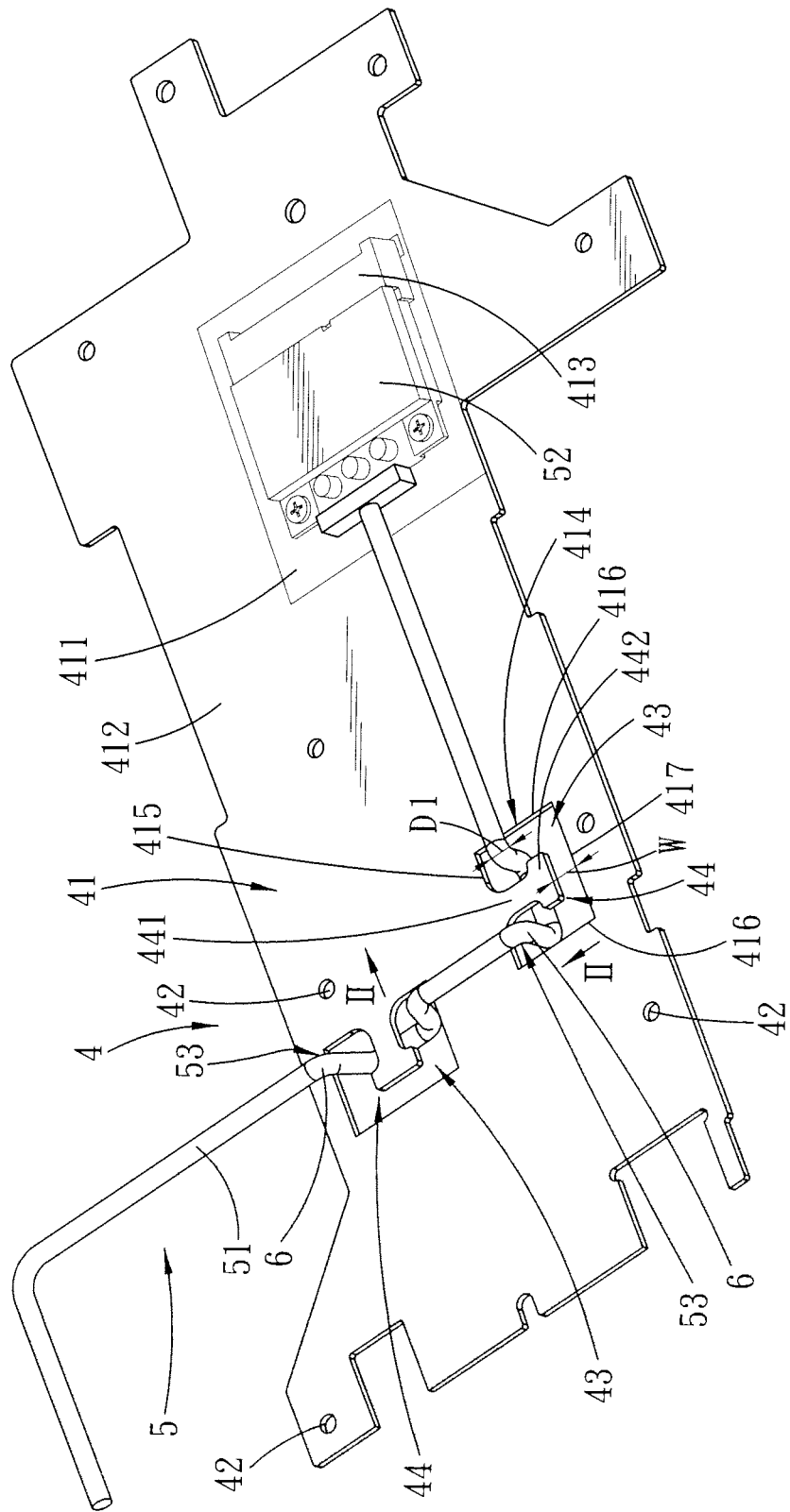

As shown in FIGS. 5, 6 and 7, when it is desired to position the transmission cable 5, the cable body 51 of the transmission cable 5 is first bent to form a plurality of bent portions 53 that are each generally U-shaped. Each of the bent portions 53 is moved in a first direction (shown by arrow (I)) so as to be extended into a corresponding one of the through holes 43, such that the bent portion 53 is disposed between the stop arm portion 442 of a corresponding one of the protruding hanger arms 44 and the third wall portion 417 of a corresponding one of the inner sidewalls 414 of the board body 41, and is disposed lower than the bottom surface of the corresponding one of the protruding hanger arms 44. Subsequently, each of the bent portions 53 is moved in a second direction (shown by arrow (II)) so as to be disposed directly beneath the bottom surface of the connecting arm portion 441 of the corresponding one of the protruding hanger arms 44. In other words, each of the bent portions 53 is formed with the segment of the transmission cable 5 passing under the corresponding one of the protruding hanger arms 44. Lastly, the cable body 51 of the transmission cable 5 is pulled tight, and the plug electrical connector 52 is plugged into the socket electrical connector 413 to complete the operation of organizing the transmission cable 5 and establishing electrical connections by the transmission cable 5. With the design of the stop arm portion 442 of each of the protruding hanger arms 44, the corresponding one of the bent portions 53 of the transmission cable 5 is prevented from slipping off the protruding hanger arm 44 in a direction opposite to the second direction (shown by arrow (II)), thereby enhancing positioning of the corresponding one of the bent portions 53.

Figure 8:
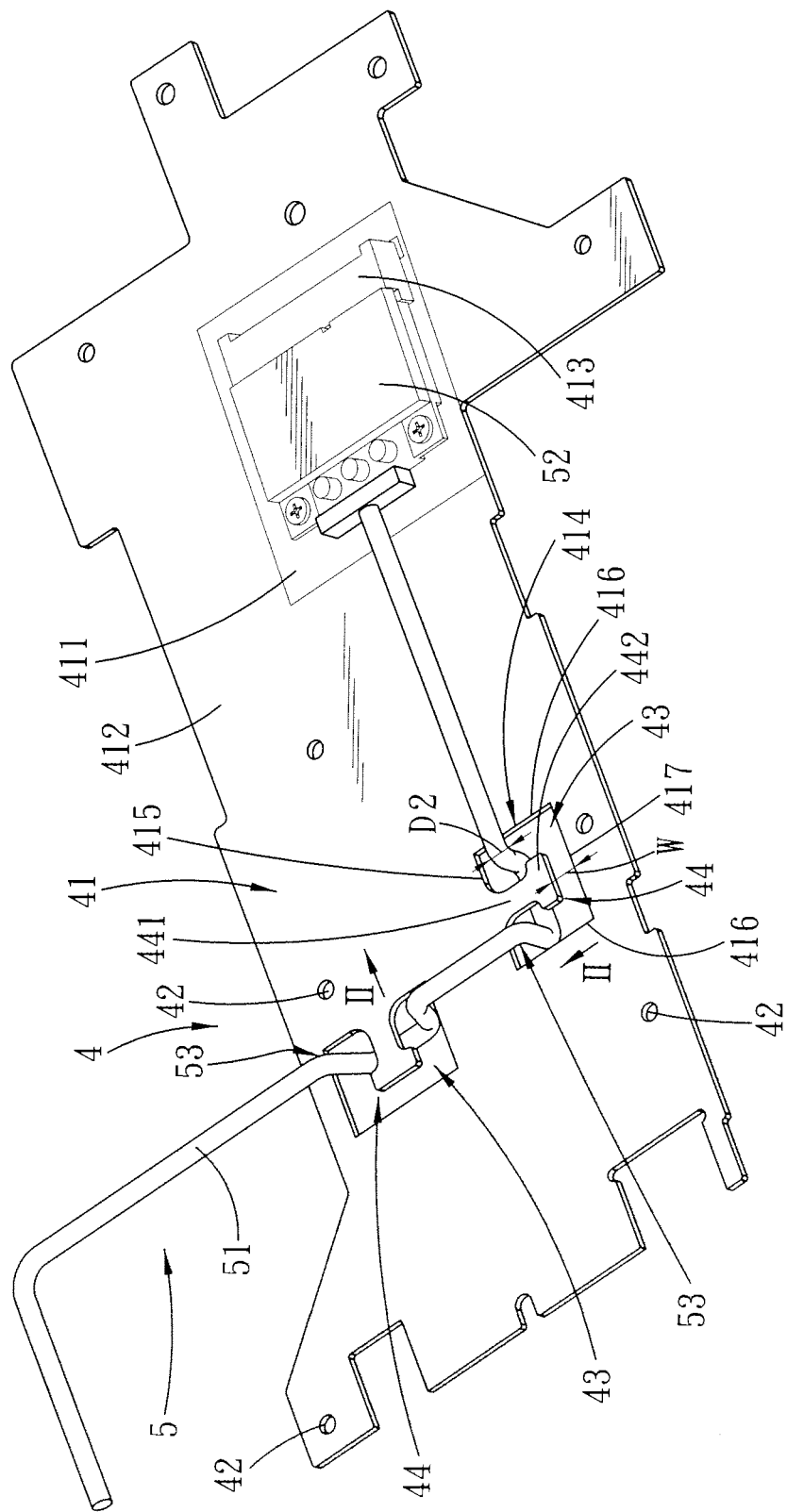
FIG. 8 is a perspective view of assembled cable-organizing circuit board and transmission cable according to a modification of the first embodiment.

Preferably, the electronic device 200 further includes a plurality of abrasion-resistant sleeves 6 that are respectively sleeved on a corresponding one of the bent portions 53 of the transmission cable 5 for contacting a corresponding one of the protruding hanger arms 44. Each of the abrasion-resistant sleeves 6 is made from rubber or silicone in order to increase the friction during contact thereof with the corresponding one of the protruding hanger arms 44, while also protecting the corresponding one of the bent portions 53 of the transmission cable 5 from wear and damage by avoiding contact of the transmission cable 5 with the corresponding one of the inner sidewalls 414 and the corresponding one of the protruding hanger arms 44. Moreover, a distance (W) between the third wall portion 417 of each inner sidewall 414 and the stop arm portion 442 of the corresponding one of the protruding hanger arms 44 is not greater than an outer diameter (D1) of the corresponding one of the abrasion-resistant sleeves 6. As such, the bent portions 53 of the transmission cable 5 are prevented from slipping off the protruding hanger arms 44 via the spaces between the corresponding third wall portions 417 and the corresponding stop arm portions 442. It should be noted herein that, as shown in FIG. 8, in a modification of the first embodiment where the electronic device 200 does not include the abrasion-resistant sleeves 6, the distance (W) between the third wall portion 417 of each of the inner sidewalls 414 and the stop arm portion 442 of the corresponding one of the protruding hanger arms 44 is not greater than an outer diameter (D2) of the transmission cable 5.

With the design of the through holes 43 in the board body 41 and the protruding hanger arms 44, an assembly operator may quickly extend the bent portions 53 of the transmission cable 5 respectively into the through holes 43 to be disposed respectively beneath the protruding hanger arms 44 so as to ensure stable and tidy positioning of the bent portions 53 of the transmission cable 5 on the cable-organizing circuit board 4. In comparison with the prior art, the time for organizing the transmission cable 5 and the production cost for producing the cable-organization structure (constituted by the through holes 43 and the protruding hanger arms 44) are both reduced, and the space available in the receiving space 21 for other electronic components of the electronic device 200 is not undesirably reduced. Furthermore, since the protruding hanger arms 44 are co-planar with the board body 41 of the cable-organizing circuit board 4, and since the through holes 43 and the protruding hanger arms 44 are formed integrally with the rest of the board body 41 through milling machining, the protruding hanger arms 44 are not prone to break or be damaged due to accidental impact during assembly of the electronic device 200.

It should be further noted herein that although the cable-organizing circuit board 4 of this embodiment is provided with the socket electrical connector 413 for connecting with the plug electrical connector 52 of the transmission cable 5, the cable-organizing circuit board 4 of this invention may be configured for use with any transmission cable 5, with or without the connectors 413, 52.

Figure 9:
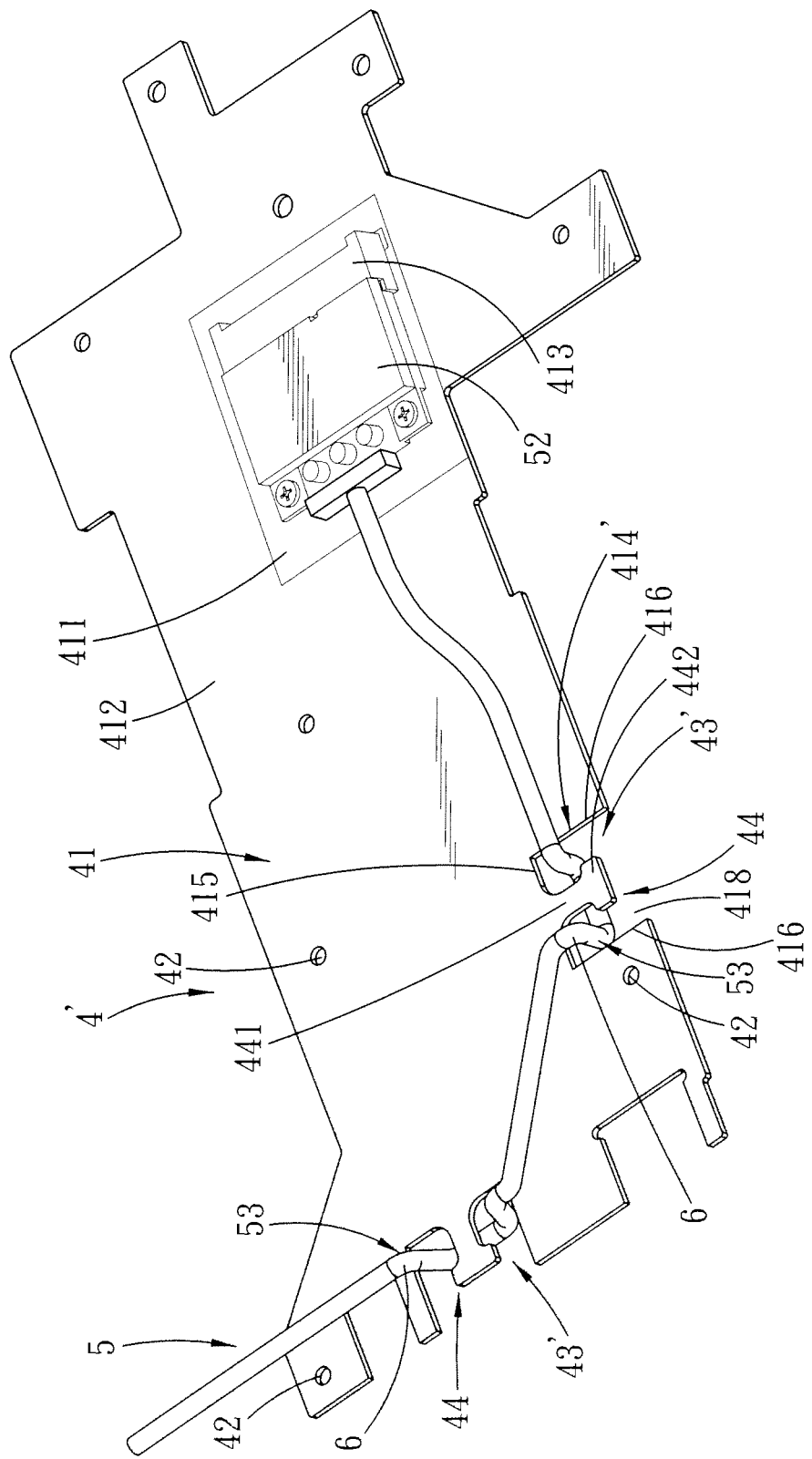
FIG. 9 is a perspective view of assembled cable-organizing circuit board and transmission cable according to the second embodiment of the present invention.

As illustrated in FIG. 9, the cable-organizing circuit board 4' according to the second embodiment of the present invention is substantially similar to the cable-organizing circuit board 4 of the first embodiment, and only differs therefrom in the configuration of the through holes 43' and the inner sidewalls 414'. In this embodiment, each of the inner sidewalls 414' includes a first wall portion 415 connected to the connecting arm portion 441 of the corresponding one of the protruding hanger arms 44, and two second wall portions 416 connected to the first wall portion 414 and respectively spaced apart from opposite sides of the corresponding one of the protruding hanger arms 44, and each of the through holes 43' has an open side 418 formed at between the second wall portions 416. In other words, each of the inner sidewalls 414' in this embodiment is generally U-shaped and has an open configuration. As such, the assembly operator may move each of the bent portions 53 of the transmission cable 5 beneath the corresponding one of the protruding hanger arms 44 with ease via the open side 418 of the corresponding one of the through holes 43'.

Figure 10:
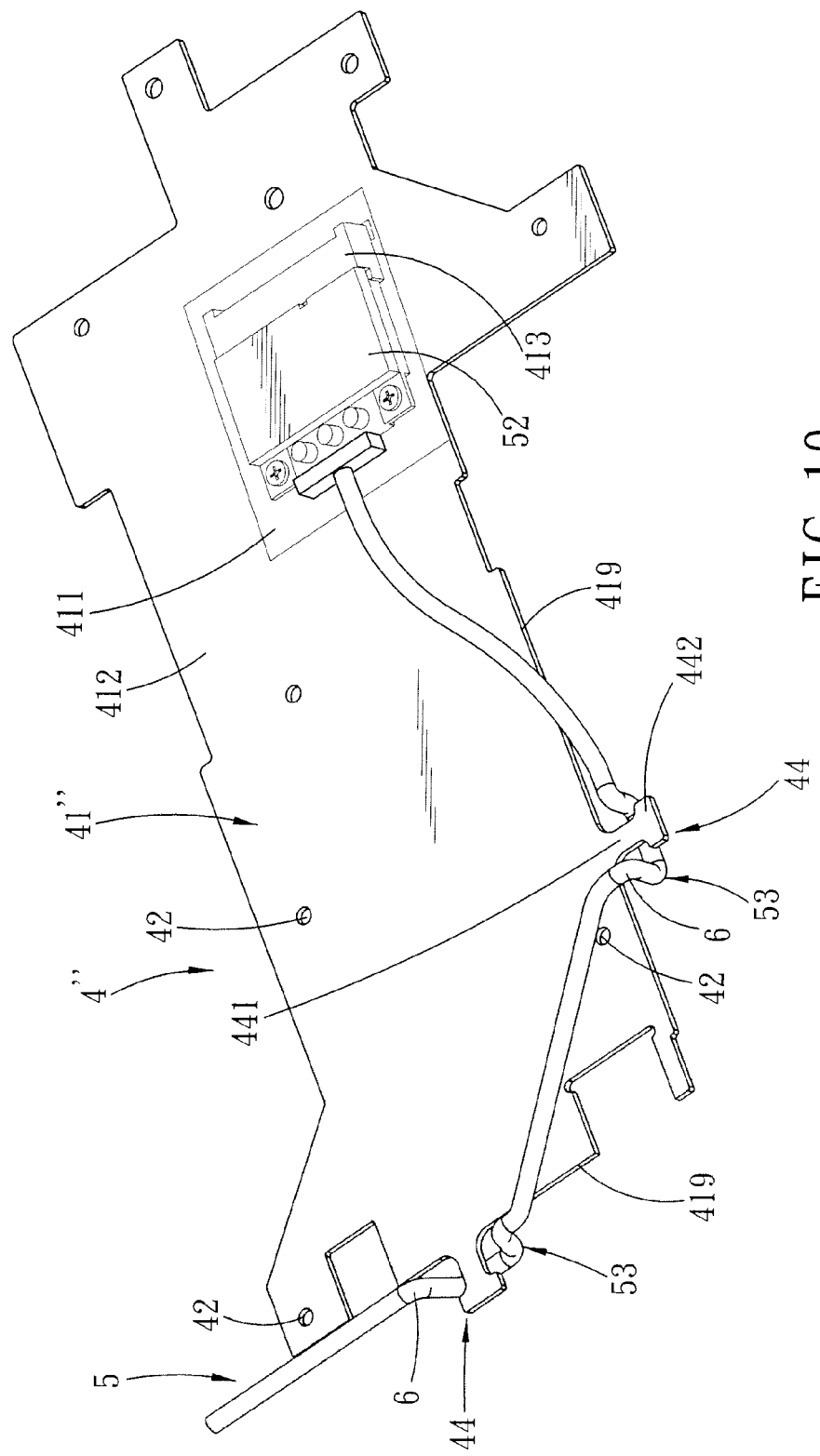
FIG. 10 is a perspective view of assembled cable-organizing circuit board and transmission cable according to the third embodiment of the present invention.

With reference to FIG. 10, the cable-organizing circuit board 4" according to the third embodiment of the present invention is substantially similar to the cable-organizing circuit board 4 of the first embodiment, and only differs therefrom in that the board body 41" of the cable-organizing circuit board 4" is not formed with the through holes 43, and that the connecting arm portion 441 of each of the protruding hanger arms 44 is connected to an outer sidewall 419 of the board body 41" at the non-circuit-layout section 412. The assembly operator may move each of the bent portions 53 of the transmission cable 5 directly beneath the corresponding one of the protruding hanger arms 44 with ease.

In summary, the electronic device 200 of the present invention has the advantage that with the design of the protruding hanger arms 44 of the cable-organizing circuit board 4, an assembly operator is able to quickly position the transmission cable 5 with ease, while ensuring stability of the positioning of the transmission cable 5. The time needed for organizing the transmission cable 5 is decreased. In addition, since the cable-organizing structure (i.e., constituted by the protruding hanger arms 44 and the optional through holes 43, 43') is formed on the circuit board itself, not only is the production cost for producing the cable-organizing structure reduced, but the space available for other electronic devices in the receiving space 21 is also not undesirably reduced with the presence of the cable-organizing structure.

While the present invention has been described in connection with what are considered the most practical and embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A cable-organizing circuit board for use with a transmission cable, said cable-organizing circuit board comprising:
    a board body having a circuit-layout section and a non-circuit-layout section that are connected to each other; and
    a protruding hanger arm disposed at said non-circuit-layout section of said board body and being co-planar with said board body, said protruding hanger arm being adapted to be permit a segment of the transmission cable to pass thereunder, the segment of the transmission cable is disposed beneath a bottom surface of said protruding hanger arm, and remaining segments of the transmission cable are disposed above a top surface of said board body opposite to said bottom surface of said protruding hanger arm when the segment of the transmission cable passes under said protruding hanger arm,
    wherein said board body further includes an inner sidewall, said protruding hanger arm being generally T-shaped, and including a connecting arm portion connected to said inner sidewall of said board body, and a stop arm portion formed at a distal end of said connecting arm portion and adapted for preventing the transmission cable from slipping off said protruding hanger arm and wherein said inner sidewall includes a first wall portion connected to said connecting arm portion of said protruding hanger arm, and two second wall portions connected to said first wall portion and respectively spaced apart from opposite sides of said protruding hanger arm and said inner sidewall further includes a third wall portion connected between said second wall portions and spaced apart from said stop arm portion of said protruding hanger arm.

2. The cable-organizing circuit board as claimed in claim 1, wherein said connecting arm portion is connected to an outer sidewall of said board body at said non-circuit-layout section.

3. The cable-organizing circuit board as claimed in claim 1, wherein said board body is formed with a through hole in said non-circuit-layout section, said through hole being adapted to permit extension of the transmission cable therethrough.

4. An electronic device, comprising:
    a housing forming a receiving space;
    a transmission cable disposed in said receiving space; and
    a cable-organizing circuit board disposed in said receiving space and including a board body having a circuit-layout section and a non-circuit-layout section that are connected to each other, and
    a protruding hanger arm disposed at said non-circuit-layout section of said board body and being co-planar with said board body, a segment of said transmission cable passing under said protruding hanger arm, the segment of said transmission cable is disposed beneath a bottom surface of said protruding hanger arm, and remaining segments of said transmission cable are disposed above a top surface of said board body opposite to said bottom surface of said protruding hanger arm when the segment of said transmission cable passes under said protruding hanger arm,
    wherein said board body further includes an inner sidewall; said protruding hanger arm is generally T-shaped, and includes a connecting arm portion connected to said inner sidewall of said board body, and a stop arm portion formed at a distal end of said connecting arm portion and adapted for preventing said transmission cable from slipping off said protruding hanger arm and wherein said inner sidewall further includes a third wall portion connected between said second wall portions and spaced apart from said stop arm portion of said protruding hanger arm and wherein said transmission cable has a bent portion that is formed with said segment of said transmission cable passing under said protruding hanger arm, said electronic device further comprising an abrasion-resistant sleeve sleeved on said bent portion of said transmission cable for contacting said protruding hanger arm, a distance between said third wall portion and said stop arm portion of said protruding hanger arm being not greater than an outer diameter of said abrasion-resistant sleeve.

5. The electronic device as claimed in claim 4, further comprising an abrasion-resistant sleeve sleeved on said transmission cable for contacting said protruding hanger arm.

6. The electronic device as claimed in claim 4, wherein said connecting arm portion is connected to an outer sidewall of said board body at said non-circuit-layout section.

7. The electronic device as claimed in claim 4, wherein said board body is formed with a through hole in said non-circuit-layout section for extension of said transmission cable therethrough.

8. The electronic device as claimed in claim 4, wherein said inner sidewall includes a first wall portion connected to said connecting arm portion of said protruding hanger arm, and two second wall portions connected to said first wall portion and respectively spaced apart from opposite sides of said protruding hanger arm, said through hole having an open side formed between said second wall portions.

* * * * *